US010936840B2

(12) United States Patent
Mienko et al.

(10) Patent No.: US 10,936,840 B2
(45) Date of Patent: Mar. 2, 2021

(54) OPTICAL SENSOR WITH ANGLED REFLECTORS

(71) Applicant: FINGERPRINT CARDS AB, Gothenburg (SE)

(72) Inventors: Marek Mienko, San Jose, CA (US); Patrick Smith, San Jose, CA (US); Arash Akhavan Fomani, Saratoga, CA (US)

(73) Assignee: FINGERPRINT CARDS AB, Gothenburg (SE)

( * ) Notice: Subject to any disclaimer, the term of this patent is extended or adjusted under 35 U.S.C. 154(b) by 82 days.

(21) Appl. No.: 16/439,007

(22) Filed: Jun. 12, 2019

(65) Prior Publication Data
US 2019/0294853 A1 Sep. 26, 2019

Related U.S. Application Data

(62) Division of application No. 15/283,007, filed on Sep. 30, 2016, now Pat. No. 10,380,395.

(51) Int. Cl.
*G06K 9/00* (2006.01)
*G06K 9/22* (2006.01)
*H01L 27/146* (2006.01)

(52) U.S. Cl.
CPC ....... *G06K 9/00013* (2013.01); *G06K 9/0008* (2013.01); *G06K 9/22* (2013.01); *H01L 27/14629* (2013.01); *H01L 27/14685* (2013.01)

(58) Field of Classification Search
CPC ............. G06K 9/0004; G06K 9/00013; G06K 9/00087; G06K 9/0008
See application file for complete search history.

(56) References Cited

U.S. PATENT DOCUMENTS 5,446,290 A 8/1995 Fujieda et al.
5,726,443 A 3/1998 Immega et al.
(Continued)

FOREIGN PATENT DOCUMENTS

CN 101814125 A 8/2010
CN 101814126 B 8/2010
(Continued)

OTHER PUBLICATIONS

Rowe et al. "Multispectral Fingerprint Image Acquisition" Springer, New York, USA, 2008 pp. 3-23.
(Continued)

*Primary Examiner* — Yosef Kassa
(74) *Attorney, Agent, or Firm* — RMCK Law Group, PLC

(57) ABSTRACT

Systems and methods for optical imaging using an optical sensor in an active area of the display are described. The optical sensor includes a set of detector elements positioned in a detector plane; a transparent layer; and a set of first reflective surfaces in the transparent layer. Each reflective surface in the first set of reflective surfaces is positioned to receive light from a portion of a sensing region of the display and to reflect the received light. The optical sensor further includes a second set of reflective surfaces, each reflective surface in the second set of reflective surfaces is positioned to receive the transmitted light from the first set of reflective surfaces, and to further reflect the received light towards one of the set of detector elements.

20 Claims, 10 Drawing Sheets

(56) References Cited

U.S. PATENT DOCUMENTS

| | | | |
|---|---|---|---|
| 5,991,467 A | 11/1999 | Kamiko | |
| 6,128,399 A | 10/2000 | Calmel | |
| 6,665,427 B1 * | 12/2003 | Keagy | G06K 9/00046 382/124 |
| 6,870,946 B1 * | 3/2005 | Teng | G06K 9/00046 356/458 |
| 7,381,941 B2 | 6/2008 | Cheng | |
| 7,465,914 B2 | 12/2008 | Eliasson et al. | |
| 7,498,391 B2 * | 3/2009 | Hashemzadeh | C08F 2/18 525/61 |
| 7,504,962 B2 | 3/2009 | Smith | |
| 7,535,468 B2 | 5/2009 | Uy | |
| 7,787,110 B2 * | 8/2010 | Raguin | G06K 9/00046 356/71 |
| 8,031,916 B2 | 10/2011 | Abiko | |
| 8,165,355 B2 | 4/2012 | Benkley | |
| 8,204,283 B2 | 6/2012 | Wu | |
| 8,204,284 B2 | 6/2012 | Wu | |
| 8,259,168 B2 | 9/2012 | Wu et al. | |
| 8,391,569 B2 | 3/2013 | Wu | |
| 8,489,901 B2 | 7/2013 | Boudreaux | |
| 8,520,912 B2 | 8/2013 | Wu et al. | |
| 8,570,303 B2 | 10/2013 | Chen | |
| 8,605,960 B2 | 12/2013 | Orsley | |
| 8,649,001 B2 | 2/2014 | Wu et al. | |
| 8,787,298 B2 * | 7/2014 | Ra | H04W 48/18 370/329 |
| 8,798,337 B2 | 8/2014 | Lei et al. | |
| 8,810,367 B2 | 8/2014 | Mullins | |
| 8,903,140 B2 | 12/2014 | Wu | |
| 8,917,387 B1 | 12/2014 | Lee et al. | |
| 9,177,190 B1 | 11/2015 | Chou et al. | |
| 9,188,546 B2 * | 11/2015 | Miesak | G06K 9/00033 |
| 9,208,394 B2 | 12/2015 | Di Venuto Dayer et al. | |
| 9,797,298 B2 * | 10/2017 | Suzuki | F02M 35/1034 |
| 2004/0252867 A1 | 12/2004 | Lan et al. | |
| 2008/0121442 A1 | 5/2008 | Boer et al. | |
| 2008/0192025 A1 | 8/2008 | Jaeger et al. | |
| 2010/0172552 A1 | 7/2010 | Wu | |
| 2010/0183200 A1 | 7/2010 | Wu | |
| 2010/0208952 A1 | 8/2010 | Wu | |
| 2010/0208954 A1 | 8/2010 | Wu | |
| 2010/0283756 A1 | 11/2010 | Ku et al. | |
| 2012/0076370 A1 | 3/2012 | Lei et al. | |
| 2012/0105614 A1 | 5/2012 | Wu et al. | |
| 2012/0321149 A1 | 12/2012 | Carver et al. | |
| 2012/0328170 A1 | 12/2012 | Wu et al. | |
| 2013/0034274 A1 | 2/2013 | Wu et al. | |
| 2013/0051635 A1 | 2/2013 | Wu et al. | |
| 2013/0119237 A1 | 5/2013 | Raguin et al. | |
| 2013/0169780 A1 | 7/2013 | Wu | |
| 2013/0222282 A1 | 8/2013 | Huang et al. | |
| 2014/0125788 A1 | 5/2014 | Wu | |
| 2014/0218327 A1 | 8/2014 | Shi et al. | |
| 2014/0292484 A1 | 10/2014 | Rowe et al. | |
| 2015/0062088 A1 | 3/2015 | Cho et al. | |
| 2015/0078633 A1 | 3/2015 | Hung | |
| 2015/0331508 A1 | 11/2015 | Nho et al. | |
| 2015/0347812 A1 | 12/2015 | Lin | |
| 2015/0347813 A1 | 12/2015 | Tsen | |
| 2015/0369661 A1 | 12/2015 | Lin | |
| 2015/0371074 A1 | 12/2015 | Lin | |
| 2015/0371075 A1 | 12/2015 | Lin | |
| 2016/0224816 A1 | 8/2016 | Smith et al. | |
| 2016/0247010 A1 | 8/2016 | Huang et al. | |

FOREIGN PATENT DOCUMENTS

| | | |
|---|---|---|
| CN | 102467660 A | 5/2012 |
| CN | 102682280 A | 9/2012 |
| CN | 202443032 U | 9/2012 |
| CN | 102842026 A | 12/2012 |
| CN | 202632318 U | 12/2012 |
| CN | 102915430 A | 2/2013 |
| CN | 102955936 A | 3/2013 |
| CN | 101814126 A | 4/2013 |
| CN | 102682280 B | 6/2013 |
| CN | 103198289 A | 7/2013 |
| CN | 102467660 B | 11/2013 |
| CN | 103810483 A | 5/2014 |
| CN | 103942537 A | 7/2014 |
| CN | 104035620 A | 9/2014 |
| CN | 104063704 A | 9/2014 |
| CN | 203838722 U | 9/2014 |
| CN | 104182727 A | 12/2014 |
| CN | 204028936 U | 12/2014 |
| CN | 104463074 A | 3/2015 |
| CN | 102915430 B | 8/2015 |
| CN | 102842026 B | 9/2015 |
| CN | 102955936 B | 9/2015 |
| EP | 2437201 A2 | 4/2012 |
| EP | 2437201 A3 | 4/2012 |
| EP | 2447883 A1 | 5/2012 |
| EP | 2555137 A1 | 2/2013 |
| EP | 2562683 A1 | 2/2013 |
| JP | 3177550 U | 8/2012 |
| KR | 20120003165 U | 5/2012 |
| KR | 200462271 Y1 | 9/2012 |
| KR | 20130016023 A | 2/2013 |
| KR | 101259310 B1 | 5/2013 |
| KR | 20130022364 A | 5/2013 |
| KR | 101307002 B1 | 9/2013 |
| TW | 201214303 A1 | 4/2010 |
| TW | 201027436 A1 | 7/2010 |
| TW | 201032145 A1 | 9/2010 |
| TW | 201115479 A1 | 5/2011 |
| TW | M435680 U1 | 2/2012 |
| TW | 201301144 A1 | 1/2013 |
| TW | I382349 B1 | 1/2013 |
| TW | I382350 B1 | 1/2013 |
| TW | I450201 B | 2/2013 |
| TW | I456510 B | 2/2013 |
| TW | 201310353 A1 | 3/2013 |
| TW | 201329872 A1 | 7/2013 |
| TW | 201419165 A | 5/2014 |
| TW | I444904 B | 7/2014 |
| TW | I448973 B | 8/2014 |
| TW | I457842 B | 10/2014 |
| TW | 201441940 A | 11/2014 |
| TW | 201308215 A1 | 2/2015 |
| TW | 201506807 A | 2/2015 |
| WO | WO 2015/041459 A1 | 3/2015 |
| WO | WO 2015/140600 A1 | 9/2015 |

OTHER PUBLICATIONS

VKANSEE Presentation prior to Sep. 30, 2015.
Cho, et al, "Embedded Nano-Si Optical Sensor in TFT-LCDs Technology and Integrated as Touch-Input Display" *Digest of Technical Papers*. vol. 42. No. 1., 2011, pp. 1818-1821.
Brown, et al., "A Continuous-Grain Silicon-System LCD With Optical Input Function" IEEE Journal of Solid-State Circuits, Dec. 12, 2007, vol. 42.
Atpina Technology White Paper "An Objective Look at FSI and BSI" May 18, 2010, 6 pages.
Durini, "High Performance Silicon Imaging: Fundamentals and Applications of CMOS and CCD Sensors" *Woodhead Publishing Series in Electronic and Optical Materials* 1st edition; May 8, 2014, pp. 98-107.
International Search Report in International Application No. PCT/US2017/052530 dated Jan. 9, 2018.
Written Opinion in International Application No. PCT/US2017/052530 dated Jan. 9, 2018.

* cited by examiner

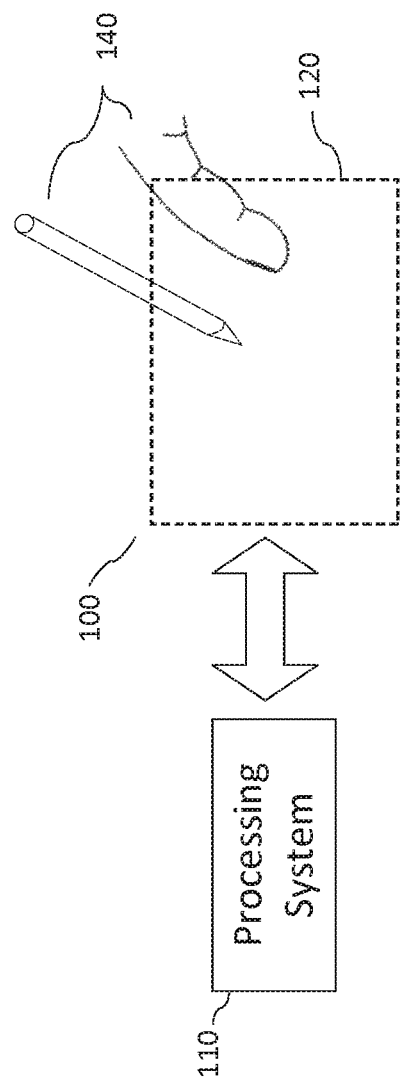

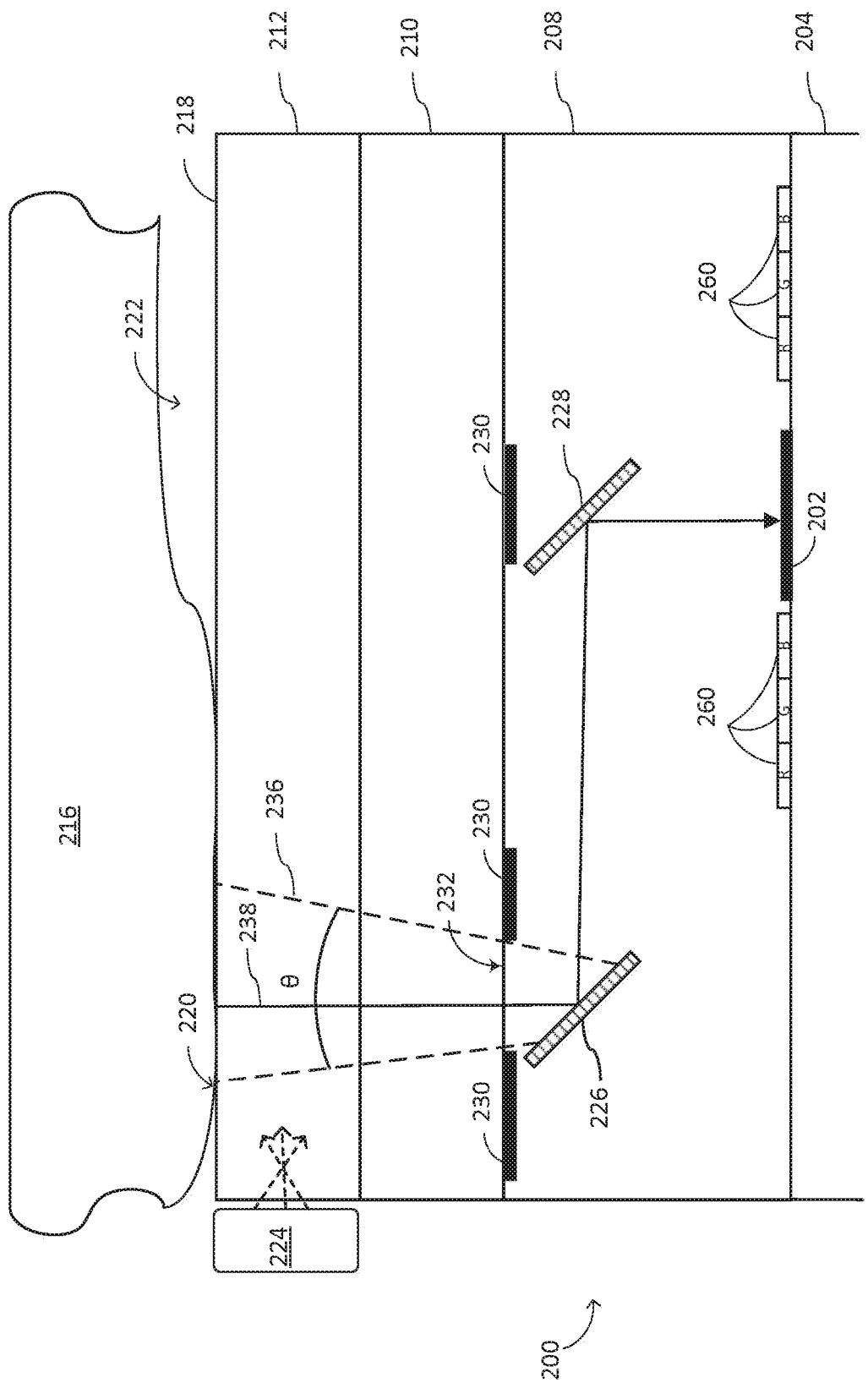

OPTICAL SENSOR WITH ANGLED REFLECTORS

CROSS-REFERENCE TO RELATED APPLICATIONS

This patent application is a divisional of U.S. patent application Ser. No. 15/283,007 filed on Sep. 30, 2016, which is incorporated by reference.

FIELD

This disclosure generally relates to optical sensors, and more particularly to an optical sensor having angled reflectors.

BACKGROUND

Object imaging is useful in a variety of applications. By way of example, biometric recognition systems image biometric objects for authenticating and/or verifying users of devices incorporating the recognition systems. Biometric imaging provides a reliable, non-intrusive way to verify individual identity for recognition purposes. Various types of sensors may be used for biometric imaging.

Fingerprints, like various other biometric characteristics, are based on distinctive personal characteristics and thus provide a reliable mechanism to recognize an individual. Thus, fingerprint sensors have many potential applications. For example, fingerprint sensors may be used to provide access control in stationary applications, such as security checkpoints. Fingerprint sensors may also be used to provide access control in mobile devices, such as cell phones, wearable smart devices (e.g., smart watches and activity trackers), tablet computers, personal data assistants (PDAs), navigation devices, and portable gaming devices. Accordingly, some applications, in particular applications related to mobile devices, may require recognition systems that are both small in size and highly reliable.

Most commercially available fingerprint sensors are based on optical or capacitive sensing technologies. While capacitive fingerprint sensors provide certain advantages, most commercially available capacitive fingerprint sensors have difficulty sensing fine ridge and valley features through large distances, requiring the fingerprint to contact a sensing surface that is close to the sensing array. It remains a significant challenge for a capacitive sensor to detect fingerprints through thick layers, such as the thick cover glass (sometimes referred to herein as a "cover lens") that protects the display of many smart phones and other mobile devices. To address this issue, a cutout is often formed in the cover glass in an area beside the display, and a discrete capacitive fingerprint sensor (often integrated with a mechanical button) is placed in the cutout area so that it can detect fingerprints without having to sense through the cover glass. The need for a cutout makes it difficult to form a flush surface on the face of device, detracting from the user experience, and complicating the manufacture. A hole in the device enclosure also can allow moisture or contaminants to enter the device. The existence of mechanical buttons also takes up valuable device real estate.

Solutions using optical fingerprint sensors usually require an optical element to condition light before the light reaches the sensor elements. Unfortunately, it remains challenging to fit conventional optical elements into the limited height available in relatively small spaces, such as found in a display stack of an electronic device.

SUMMARY

One aspect provides an optical sensor for imaging a biometric input object in the active area of a display. The optical sensor includes a plurality of imaging cells, each imaging cell images a portion of the biometric input object to be imaged. Each imaging cell includes a first detector element positioned in a detector plane; a first reflective surface, the first reflective surface positioned to receive light from a first sensing region of the display and to reflect the received light; and a second reflective surface, the second reflective surface positioned to receive the reflected light from the first reflective surface, and to further reflect the light in a path that is substantially normal to the detector plane and towards the first detector element.

Another aspect provides a display having an optical sensor for imaging a biometric input object in an active area of the display. The optical sensor includes a set of detector elements positioned in a detector plane; a transparent layer; a set of first reflective surfaces in the transparent layer, each reflective surface in the first set of reflective surfaces positioned to receive light from a portion of a sensing region of the display and to reflect the received light; and a second set of reflective surfaces, each reflective surface in the second set of reflective surfaces positioned to receive the reflected light from the first set of reflective surfaces, and to further reflect the received light in a path that is substantially normal to the detector plane and towards a detector element in the set of detector elements.

Another aspect provides a method for making an optical fingerprint sensor. The method includes forming a first transparent layer from a first transparent material having a first index of refraction; forming an array of voids on a top of the first transparent layer, the voids having angled surfaces; forming a first reflective surface at a first angled surface and a second reflective surface at a second angled surface, wherein the first reflective surface is configured to receive light from above and reflect light towards the second reflective surface, and the second reflective surface is configured to receive the reflected light and to further reflect the light towards a detector element. The method further includes forming a second transparent layer from a second transparent material having a second index of refraction; wherein the second transparent material fills the array of voids.

BRIEF DESCRIPTION OF THE DRAWINGS

FIG. 1 is a block diagram of an example of a sensing system.

FIGS. 2A-2C are schematic diagrams of sensor arrangements for imaging an input object, wherein the detector element detects light from above.

DETAILED DESCRIPTION

Figure 2A:
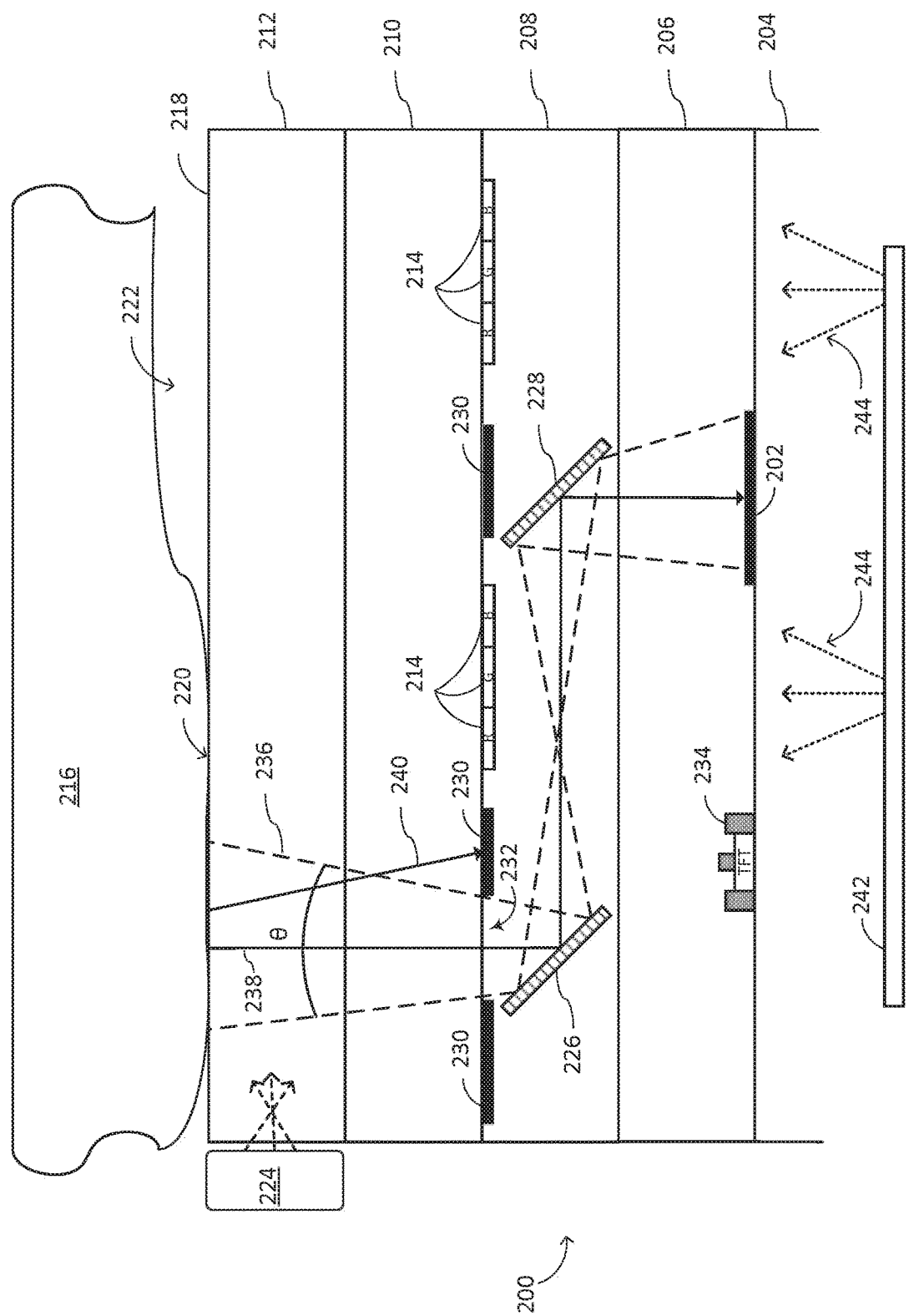

The following detailed description is exemplary in nature and is not intended to limit the disclosure or the application and uses of the disclosure. Furthermore, there is no intention to be bound by any expressed or implied theory presented in the preceding field, background, summary, brief description of the drawings, or the following detailed description.

Turning to the drawings, and as described in greater detail herein, embodiments provide systems and methods to optically image an input object such as biometric objects including fingerprints. In particular, a system and method are described for an in-display optical imaging system including of an array of imaging cells, which include dual-mirror periscope like arrangements. When combined with an array of detector elements and corresponding readout circuitry in the display, the imaging system is suitable for integration of a biometric sensor, such as a fingerprint sensor, with a display, such as for example a liquid crystal display (LCD), light emitting diode (LED) display or organic LED (OLED) display. Each imaging cell, including the dual-mirror arrangement, serves as an optical element, which limits the field of view seen by each detector and the area it samples on the biometric, e.g. finger. The sensor arrangement may be fabricated as part of the display, for example, on the encapsulating glass (color filter glass in case of LCD) or the active backplane of the display. The arrangement reduces thickness of the optical sensor and minimizes or eliminates interference with display image quality.

FIG. 1 is a block diagram of an exemplary sensing system having a sensor 100, in accordance with embodiments of the disclosure. The sensor 100 may be configured to provide input to an electronic system (also "electronic device"). Some non-limiting examples of electronic systems include personal computers of all sizes and shapes, such as desktop computers, laptop computers, netbook computers, tablets, e-book readers, personal digital assistants (PDAs), and wearable computers (such as smart watches and activity tracker devices). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The sensor 100 can be implemented as a physical part of the electronic system, or can be physically separate from the electronic system. In accordance with the disclosure, the sensor 100 may be integrated as part of a display of an electronic device. As appropriate, the sensor 100 may communicate with parts of the electronic system using any one or more of the following: buses, networks, and other wired or wireless interconnections. Examples include I²C, SPI, PS/2, Universal Serial Bus (USB), Bluetooth, RF, and IRDA.

The sensor 100 is configured to sense input provided by one or more input objects 140 in a sensing region 120. In one embodiment, the input object 140 is a finger, and the sensor 100 is implemented as a fingerprint sensor (also "fingerprint scanner") configured to detect fingerprint features of the input object 140. In other embodiments, the sensor 100 may be implemented as vascular sensor (e.g., for finger vein recognition), hand geometry sensor, or a proximity sensor (such as a touch pad, touch screen, and or other touch sensor device).

Sensing region 120 encompasses any space above, around, in, and/or near the sensor 100 in which the sensor 100 is able to detect input (e.g., user input provided by one or more input objects 140). The sizes, shapes, and locations of particular sensing regions may vary widely from embodiment to embodiment. In some embodiments, the sensing region 120 extends from a surface of the sensor 100 in one or more directions into space. In various embodiments, input surfaces may be provided by surfaces of casings within which sensor elements reside, by face sheets applied over the sensor elements or any casings, etc. In some embodiments, the sensing region 120 has a rectangular shape when projected onto an input surface of the input device 100.

The sensor 100 may utilize any combination of sensor components and sensing technologies to detect user input in the sensing region 120. The sensor 100 comprises one or more detector elements (or "sensing elements") for detecting user input. Some implementations utilize arrays or other regular or irregular patterns of sensing elements to detect the input object 140.

In the optical implementations of the input device 100 set forth in this disclosure, one or more detector elements detect light from the sensing region. In various embodiments, the detected light may be reflected from input objects in the sensing region, emitted by input objects in the sensing region, or some combination thereof. Example optical detector elements include photodiodes, CMOS arrays, CCD arrays, photodiodes, and other types of photosensors configured to detect light in the visible or invisible spectrum (such as infrared or ultraviolet light). The photosensors may be thin film photodetectors, such as thin film transistors (TFTs) or thin film diodes.

Some optical implementations provide illumination to the sensing region. Reflections from the sensing region in the illumination wavelength(s) are detected to determine input information corresponding to the input object.

Some optical implementations rely on principles of direct illumination of the input object, which may or may not be in contact with an input surface of the sensing region depending on the configuration. One or more light sources and/or light guiding structures may be used to direct light to the sensing region. When an input object is present, this light is reflected from surfaces of the input object, which reflections can be detect by the optical sensing elements and used to determine information about the input object.

Some optical implementations rely on principles of internal reflection to detect input objects in contact with the input surface of the sensing region. One or more light sources may be used to direct light in a transmitting medium at an angle at which it is internally reflected at the input surface of the sensing region, due to different refractive indices at opposing sides of the boundary defined by the sensing surface. Contact of the input surface by the input object causes the refractive index to change across this boundary, which alters the internal reflection characteristics at the input surface. Higher contrast signals can often be achieved if principles of frustrated total internal reflection (FTIR) are used to detect the input object. In such embodiments, the light may be directed to the input surface at an angle of incidence at which it is totally internally reflected, except where the input object is in contact with the input surface and causes the light to partially transmit across this interface. An example of this is presence of a finger introduced to an input surface defined by a glass to air interface. The higher refractive index of human skin compared to air causes light incident at the input surface at the critical angle of the interface to air to be partially transmitted through the finger, where it would otherwise be totally internally reflected at the glass to air interface. This optical response can be detected by the system and used to determine spatial information. In some embodiments, this can be used to image small scale fingerprint features, where the internal reflectivity of the incident light differs depending on whether a ridge or valley is in contact with that portion of the input surface.

Some implementations are configured to provide images that span one, two, three, or higher dimensional spaces. The input device may have a sensor resolution that varies from embodiment to embodiment depending on factors such as the particular sensing technology involved and/or the scale of information of interest. For example, some biometric sensing implementations may be configured to detect physiological features of the input object (such as fingerprint ridge features of a finger, or blood vessel patterns of an eye), which may utilize higher sensor resolutions and present different technical considerations from some proximity sensor implementations that are configured to detect a position of the input object with respect to the sensing region (such as a touch position of a finger with respect to an input surface). In some embodiments, the sensor resolution is determined by the physical arrangement of an array of sensing elements, where smaller sensing elements and/or a smaller pitch can be used to define a higher sensor resolution.

In some embodiments, the sensor 100 is implemented as a fingerprint sensor having a sensor resolution high enough to capture features of a fingerprint. In some implementations, the fingerprint sensor has a resolution sufficient to capture minutia (including ridge endings and bifurcations), orientation fields (sometimes referred to as "ridge flows"), and/or ridge skeletons. These are sometimes referred to as level 1 and level 2 features, and in an exemplary embodiment, a resolution of at least 250 pixels per inch (ppi) is capable of reliably capturing these features. In some implementations, the fingerprint sensor has a resolution sufficient to capture higher level features, such as sweat pores or edge contours (i.e., shapes of the edges of individual ridges). These are sometimes referred to as level 3 features, and in an exemplary embodiment, a resolution of at least 750 pixels per inch (ppi) is capable of reliably capturing these higher level features.

In some embodiments, the fingerprint sensor is implemented as a placement sensor (also "area" sensor or "static" sensor) or a swipe sensor (also "slide" sensor or "sweep" sensor). In a placement sensor implementation, the sensor is configured to capture a fingerprint input as the user's finger is held stationary over the sensing region. Typically, the placement sensor includes a two dimensional array of sensing elements capable of capturing a desired area of the fingerprint in a single frame. In a swipe sensor implementation, the sensor is configured to capture to a fingerprint input based on relative movement between the user's finger and the sensing region. Typically, the swipe sensor includes a linear array or a thin two-dimensional array of sensing elements configured to capture multiple frames as the user's finger is swiped over the sensing region. The multiple frames may then be reconstructed to form an image of the fingerprint corresponding to the fingerprint input. In some implementations, the sensor is configured to capture both placement and swipe inputs.

In some embodiments, the fingerprint sensor is configured to capture less than a full area of a user's fingerprint in a single user input (referred to herein as a "partial" fingerprint sensor). Typically, the resulting partial area of the fingerprint captured by the partial fingerprint sensor is sufficient for the system to perform fingerprint matching from a single user input of the fingerprint (e.g., a single finger placement or a single finger swipe). Some example imaging areas for partial placement sensors include an imaging area of 100 mm$^2$ or less. In another exemplary embodiment, a partial placement sensor has an imaging area in the range of 20-50 mm$^2$. In some implementations, the partial fingerprint sensor has an input surface that is the same size as the imaging area.

While the input device is generally described in the context of a fingerprint sensor in FIG. 1, embodiments include other biometric sensor devices. In various embodiments, a biometric sensor device may be configured to capture physiological biometric characteristics of a user. Some example physiological biometric characteristics include fingerprint patterns, vascular patterns (sometimes known as "vein patterns"), palm prints, and hand geometry.

In FIG. 1, a processing system 110 is shown in communication with the input device 100. The processing system 110 comprises parts of or all of one or more integrated circuits (ICs) including microprocessors, microcontrollers and the like and/or other circuitry components. In some embodiments, the processing system may be configured to operate hardware of the input device to capture input data, and/or implement a biometric process or other process based on input data captured by the sensor 100.

In some implementations, the processing system 110 is configured to operate sensor hardware of the sensor 100 to detect input in the sensing region 120. In some implementations, the processing system comprises driver circuitry configured to drive signals with sensing hardware of the input device and/or receiver circuitry configured to receive signals with the sensing hardware.

For example, a processing system for an optical sensor device may comprise driver circuitry configured to drive illumination signals to one or more LEDs, an LCD backlight or other light sources, and/or receiver circuitry configured to receive signals with optical receiving elements.

In some embodiments, the processing system 110 comprises electronically-readable instructions, such as firmware code, software code, and/or the like. In some embodiments, the processing system 110 includes memory for storing electronically-readable instructions and/or other data, such as reference templates for biometric recognition. The processing system 110 can be implemented as a physical part of the sensor 100, or can be physically separate from the sensor 100. The processing system 110 may communicate with parts of the sensor 100 using buses, networks, and/or other wired or wireless interconnections. In some embodiments, components composing the processing system 110 are located together, such as near sensing element(s) of the sensor 100. In other embodiments, components of processing system 110 are physically separate with one or more components close to sensing element(s) of sensor 100, and one or more components elsewhere. For example, the sensor 100 may be a peripheral coupled to a computing device, and the processing system 110 may comprise software configured to run on a central processing unit of the computing device and one or more ICs (perhaps with associated firmware) separate from the central processing unit. As another example, the sensor 100 may be physically integrated in a mobile device, and the processing system 110 may comprise circuits and/or firmware that are part of a central processing unit or other main processor of the mobile device. In some embodiments, the processing system 110 is dedicated to implementing the sensor 100. In other embodiments, the processing system 110 performs functions associated with the sensor and also performs other functions, such as operating display screens, driving haptic actuators, running an operating system (OS) for the electronic system, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes. In one or more embodiments, a first and second module may be comprised in separate integrated circuits. For example, a first module may be comprised at least partially within a first integrated circuit and a separate module may be comprised at least partially within a second integrated circuit. Further, portions of a single module may span multiple integrated circuits.

In some embodiments, the processing system 110 responds to user input (or lack of user input) in the sensing region 120 directly by causing one or more actions. Example actions include unlocking a device or otherwise changing operation modes, as well as GUI actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the sensor 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, authenticate a user, and the like.

In some embodiments, the sensing region 120 of the sensor 100 overlaps at least part of an active area of a display screen, such as embodiments where the sensor 100 comprises a touch screen interface and/or biometric sensing embodiments configured to detect biometric input data over the active display area. For example, the sensor 100 may comprise substantially transparent sensor electrodes. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The display screen may also be flexible or rigid, and may be flat, curved, or have other geometries. In some embodiments, the display screen includes a glass or plastic substrate for TFT circuitry and/or other circuitry, which may be used to provide visuals and/or provide other functionality. In some embodiments, the display device includes a cover lens (sometimes referred to as a "cover glass") disposed above display circuitry which may also provide an input surface for the input device. Example cover lens materials include plastic, optically clear amorphous solids, such as chemically hardened glass, as well as optically clear crystalline structures, such as sapphire. In accordance with the disclosure, the sensor 100 and the display screen may share physical elements. For example, some embodiments may utilize some of the same electrical components for displaying visuals and for input sensing. In one embodiment, one or more display electrodes of a display device may configured for both display updating and input sensing. As another example, the display screen may be operated in part or in total by the processing system 110 in communication with the input device.

FIG. 2A illustrates an example of an arrangement for an optical sensor device 200 integrated in a display according to certain embodiments. In the example shown in FIG. 2A, the display is an LCD display; although as will be apparent from the descriptions that follows, the sensor device 200 may be integrated with other types of displays, such as LED and OLED displays.

The sensor 200 includes detector elements 202 mounted on a bottom substrate 204 forming a detector plane, a liquid crystal layer 206, a reflective layer 208, a top substrate 210 and a cover layer 212. The sensor 200 also includes various display elements, which in the context of the LCD display include color filters 214 used to present varying colors, liquid crystals within liquid crystal layer 206, TFTs 234, which are collectively used to output an electronic graphical display visible to a user. Also shown is an input object 216, which is any object to be imaged (e.g., fingerprint). It will be appreciated that the components and layers shown are for purposes of illustration only and may vary depending on the particular display into which the sensor arrangement is integrated.

The cover layer 212 (e.g., cover lens or cover glass) is provided as part of the display to protect inner components of the sensor 200 such as the detector elements 202, the display elements (e.g. 214, 234) and active backplane. A top surface 218 of the cover layer 212 forms a sensing surface, which provides a contact area for the input object 216. It will be understood that the sensing surface 218 forms part of a sensing region in which an object may be imaged. As previously described, the sensing region may extend above the actual sensing surface 218. For simplicity, the cover layer 212 is shown as a single layer. The cover layer 212 may include multiple layers and/or may be combined with the top substrate 210. The cover layer 212 and top substrate 210 may be made from any suitable material, typically a transparent material.

Although generally described as a fingerprint for illustrative purposes, the input object 216 is any object to be imaged. Generally, the object 216 will have various features. By way of example, the object 216 has ridges 220 and valleys 222. Due to their protruding nature, the ridges 220 contact the sensing surface 218. The valleys 222 do not contact the sensing surface 218 and instead form an air gap between the input object 216 and the sensing surface 218. Such features may be optically imaged using direct illumination or by relying on principles of total internal reflection (TIR).

The detector elements 202 are disposed on or near the bottom substrate 204 and may be any suitable type of photo detector. For example, the detector elements 202 may be made from amorphous silicon or polysilicon and may be constructed as photoresistors or thin film photodetectors, such as thin film transistors (TFTs) or thin film photodiodes (e.g. pin or pn diodes).

In an LCD arrangement, the display elements include various color filters 214 (e.g., red, green, blue), which may be positioned in the reflective layer 208, or which may be in a separate layer. The color filers 214 are used in conjunction with the liquid crystal layer 206, backlight 242, TFT's 234 and associated circuitry to render the display to a user in a manner known to those skilled in the art. The TFT's 234 and associated circuitry may be located on the bottom substrate 204.

In certain embodiments, a light source 224 is used as the light source for optical imaging. The light source 224 transmits light to the sensing surface 218, which is then reflected and detected by the detector elements 202 as described further below. However, it will be understood that a separate light source need not be used. For example, light 244 from the LCD backlight 242 may be used for the optical imaging.

In the example stack up shown, the reflective layer 208 is positioned below the top substrate 210 and above the liquid crystal layer 206. The reflective layer 208 includes an array of imaging cells including dual-mirrors, which form periscope type arrangements for directing light reflected from the input object to detector elements. The reflective layer 208 is generally made of any transparent material (e.g., glass, epoxy resin such as SU8 and the like). Each imaging cell includes a first reflective surface 226 and a second reflective surface 228. The reflective surfaces 226 and 228 are configured to reflect light and may be constructed, for example, as mirrored surfaces. Although shown as flat surfaces, the reflective surfaces may be curved in a concave or convex arrangement to direct the light as desired. In an alternative arrangement, mirrored surfaces need not be used. For example, first reflective surfaces 226 and second reflective surface 228 may be formed as boundaries between areas having differing indices of refraction, which boundaries provide for total internal reflection to direct light along a path as described below.

A blocking layer having masked surfaces 230 may be disposed toward the top of, or above, the reflective layer 208. The masked surfaces 230 form apertures 232 above at least the first reflective surface 226. The apertures 232 are configured to permit the transmission of certain light reflected from the sensing surface 218 into portions of the reflective layer 208 so as to reach the first reflective surface 226. The masked surfaces 230 may be constructed of a light absorbing material, reflecting material or other material that occludes light from passing through areas other than through defined apertures, e.g. apertures 232, thereby preventing or limiting unwanted stray light from reaching the detector elements 202. In the embodiment of FIG. 2A, the masked surfaces 230 may also generally be disposed above the second reflective surface 228.

The detector elements 202 detect light, which is reflected at sensing surface 218 and/or the input object 216, through the apertures 232, which light is first reflected off first reflective surface 226 towards the second reflective surface 228. The light is received by the second reflective surface 228 and further reflected towards the detector element 202. The detector element 202 receives and detects the light. Thus, as shown in the embodiment of FIG. 2A, the detector element 202 detects light from above.

Light reaching a given detector element 202 is generally restricted to an acceptance cone 236, having an acceptance angle θ to prevent blurring of the image of the input object 216. In the illustrated example, acceptance cone 236 corresponds to detector element 202. The acceptance cone 236 may, for example, be limited to a few degrees. The acceptance angle θ determines the degree of image blurring and the maximum distance from the detector elements 202 that the input object 216 can be located while still achieving a given image resolution. The acceptance angle θ is dependent upon a width of the aperture 232, width of reflective surfaces 226 and 228, and/or the distance between the reflective surfaces 226 and 228. A photo-detector surface area of the detector element 202 may also be used to control the acceptance angle.

An example of light falling within the acceptance cone 236 is illustrated by light ray 238. As shown, light ray 238 is transmitted from a surface of input object 216, through aperture 232 to the first reflective surface 226, where the light is reflected towards the second reflective surface 228 in a path that is substantially or generally parallel to the detector plane relative to the orientation shown. The light is then further reflected by the second reflective surface 228 towards the detector element 202 in a path that is substantially or generally normal to the detector plane relative to the orientation shown. The light is then received and detected by the detector element 202. In contrast, light ray 240, which falls at least partially outside of the acceptance cone 236, is blocked by other portions of the display such as the masked surface 230.

Only one detector element 202 is shown with corresponding aperture 232 and reflective surfaces 226, 228 defining the acceptance cone 236. The acceptance cone 236 in turn corresponds to a portion of area to be imaged of the input object 216. It will be appreciated that the sensor 200 will have as many detector elements 202 as needed to image a desired area of the input object 216 and each detector element 202 will have associated apertures (e.g., 232) and reflective surfaces 226, 228 to define an acceptance cone corresponding to an area of the input object 216 to be imaged. Typically, although not necessarily, all detector elements 202 will generally be in the same plane, referred to herein as the detector plane. The pitch of detector elements will depend on the resolution desired. The processing system 110 (FIG. 1) may include software and/or hardware which processes individual data obtained via the detector elements, which data may then be stitched together and/or logically combined via a template to form a complete or partial image of an input object (e.g. fingerprint) as desired.

Figure 2B:
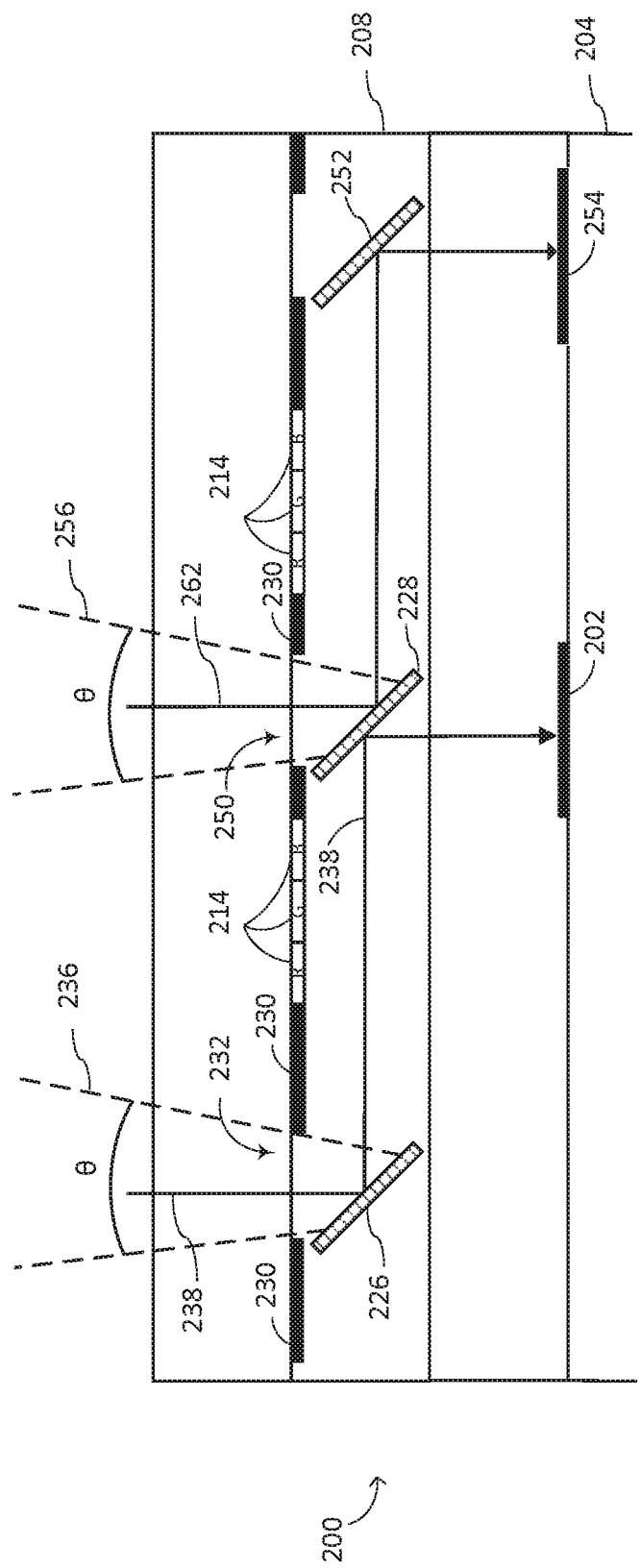

FIG. 2B illustrates an alternative embodiment of the arrangement of FIG. 2A. FIG. 2B depicts the masked surfaces 230 forming aperture 232 and first reflective surface 226 and second reflective surface 228, which combine to form acceptance cone 236. Light falling within the acceptance cone 236 is directed by the first reflective surface 226 and the second reflective surface 228 to the top surface of detector element 202 in the same manner as described in connection with FIG. 2A.

In FIG. 2B, the masked surfaces 230 additionally form aperture 250 above the second reflective surface 228. The inclusion of the aperture 250 above reflective surface 228 permits the formation of a second acceptance cone 256.

Light transmitted from an area of input object 216, which falls within the acceptance cone 256 enters the reflective layer 208 through aperture 250, is reflected by the second reflective surface 228 towards a third reflective surface 252. The third reflective surface then receives and reflects the light originating from acceptance cone 256 to a second detector element 254 where the light is received.

It will be appreciated that the arrangement of FIG. 2B uses each reflective surface to provide the multiple functions of receiving light from an input object, reflecting the light towards another mirrored surface; and receiving light from yet another mirrored surface and reflecting that light towards a detector element. The functions are illustrated by light rays 238 and 262 relative to the reflective surface 228. The arrangement of FIG. 2B may provide for a more compact design compared with the embodiment of FIG. 2A since fewer reflective surfaces are needed to achieve a given resolution.

As described in connection with FIG. 2A, the pattern of reflective surfaces and apertures repeats at a pitch as appropriate to provide an imaging area of desired size and resolution.

FIG. 2C illustrates another embodiment wherein the dual-mirror arrangement is shown integrated in an OLED or LED type display.

In the embodiment of FIG. 2C, the masked surfaces 230, apertures 232, first reflective surface 226, second reflective surface 228 and detector element 202 are arranged and function as described in connection with FIG. 2A to define the acceptance cone 236. In the manner previously described, light from within the acceptance cone 236 is guided by the first reflective surface 226 and second reflective surface 228 such that the light reaches detector element 202 as illustrated by light ray 238. Light falling outside of the acceptance cone 236 is generally prevented from reaching the detector elements 202. For example, such light is blocked by masked surfaces 230 as shown by light ray 240 (FIG. 2A).

In the example, the liquid crystal layer 206 is not provided and the bottom substrate 204 with detector element 202 may thus be more or less directly below reflective layer 208. In addition, the display elements include LEDs or OLEDs 260 on the detector plane, which may be disposed on or near the bottom substrate 204. Thus, the LEDs or OLEDs 260 may be in generally the same plane as the detector elements 202, although it will be understood that positioning of the LEDs or OLEDs in a different plane from the detector elements 202 is also contemplated. The LEDs or OLEDs 260 may be used as the light source used to illuminate the input object 216, although separate light source 224 may be used instead of, or in combination with, the LEDs or OLEDs 260.

It will be readily understood that the arrangement of FIG. 2C can be arranged in accordance with the multi-function reflective surfaces of FIG. 2B.

In FIGS. 2A-2C, the sensor 200 is configured to direct light so that the detector elements 202 detect light from above with the first and second reflective surfaces 226, 228 being configured appropriately. For example, in the embodiments shown, the first and second reflective surfaces 226, 228 are generally parallel to one another. In the particular examples, the angle of the reflective surfaces 226, 228 is about 40-50 degrees from horizontal, although other angles may be used. The detector elements 202 are below masked surfaces 230 and reflective surfaces 226, 228.

Figure 3:
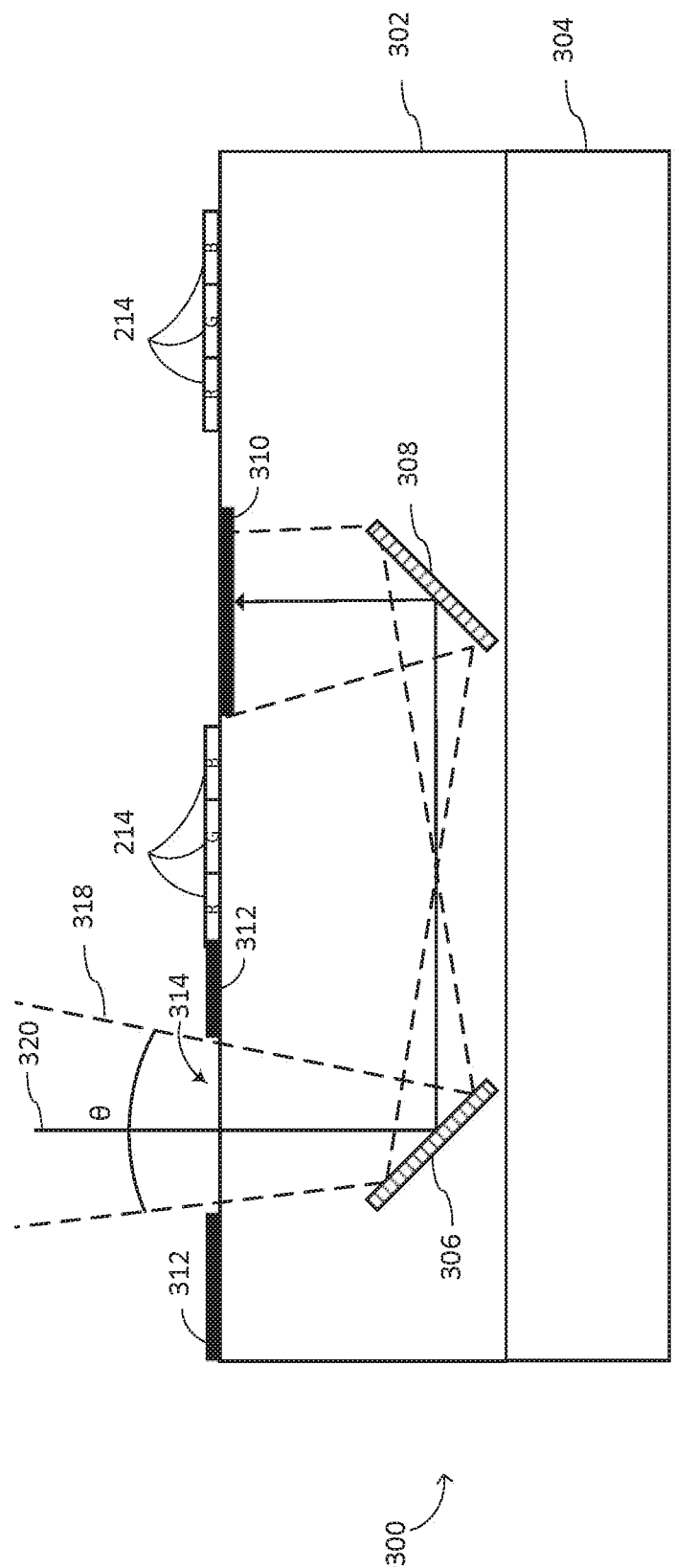
FIG. 3 is a schematic diagram of a sensor arrangement for imaging an input object, wherein the detector element detects light from below.

FIG. 3 illustrates a sensor arrangement 300 that may be used in yet another embodiment. In contrast to the embodiments described in connection with FIGS. 2A-2C, wherein the detector elements detect light from above, the sensor arrangement 300 includes detector elements positioned to detect light from below and the orientation (e.g., angle) of the second reflective surface is adjusted accordingly.

The arrangement includes reflective layer 302 positioned above a bottom substrate 304. The reflective layer 302 includes first reflective surface 306 and a second reflective surface 308. A detector element 310 is positioned above the second reflective surface 308. Masked surfaces 312 form aperture 314 above the first reflective surface 306. A light shield (not shown) may be provided above the detector element to reduce the possibility of interference by stray light. Typically, the light shield will be close to the detector element 310, e.g., 1-2 um. Thus, for example, the shield may comprise metal layers formed when depositing drive or sense electrodes or other parts of TFTs.

Similar to FIGS. 2A and 2C, the first reflective surface 306 and the second reflective surface 308 and aperture 314 define an acceptance cone 318 having acceptance angle θ. As illustrated, light, such as light ray 320 falling within the acceptance cone will reach the bottom of detector element 310. Specifically, light ray 320 is reflected from the input object (not shown) and is transmitted through aperture 314. The light ray 320 reaches the first reflective surface 306. The light ray 320 is then reflected towards the second reflective surface 308 in a path that is generally or substantially parallel to the detector plane relative to the orientation shown. The second reflective surface 308 is configured to then further reflect the light upwards towards the detector element 310 in a path that is generally or substantially normal to the detector plane relative to the orientation shown. The detector element 310 then receives the light. Light falling outside of the acceptance cone will generally be blocked by other systems components such as masked surfaces 312.

As noted, the first reflective surface 306 and the second reflective surface 308 are configured to direct light such that the detector element 310 detects light from below. In the particular example of FIG. 3, the first reflective surface 306 has an angle of about 40-50 degrees from horizontal relative to the orientation shown. Unlike FIGS. 2A-2C, the second reflective surface 308 is not parallel with the first reflective surface 306. Instead, the second reflective surface 308 has an angle of about 130 to 140 degree from horizontal relative to the orientation shown. The detector element 310 is above the first and second reflective surfaces 308 and 306.

Figure 4A:
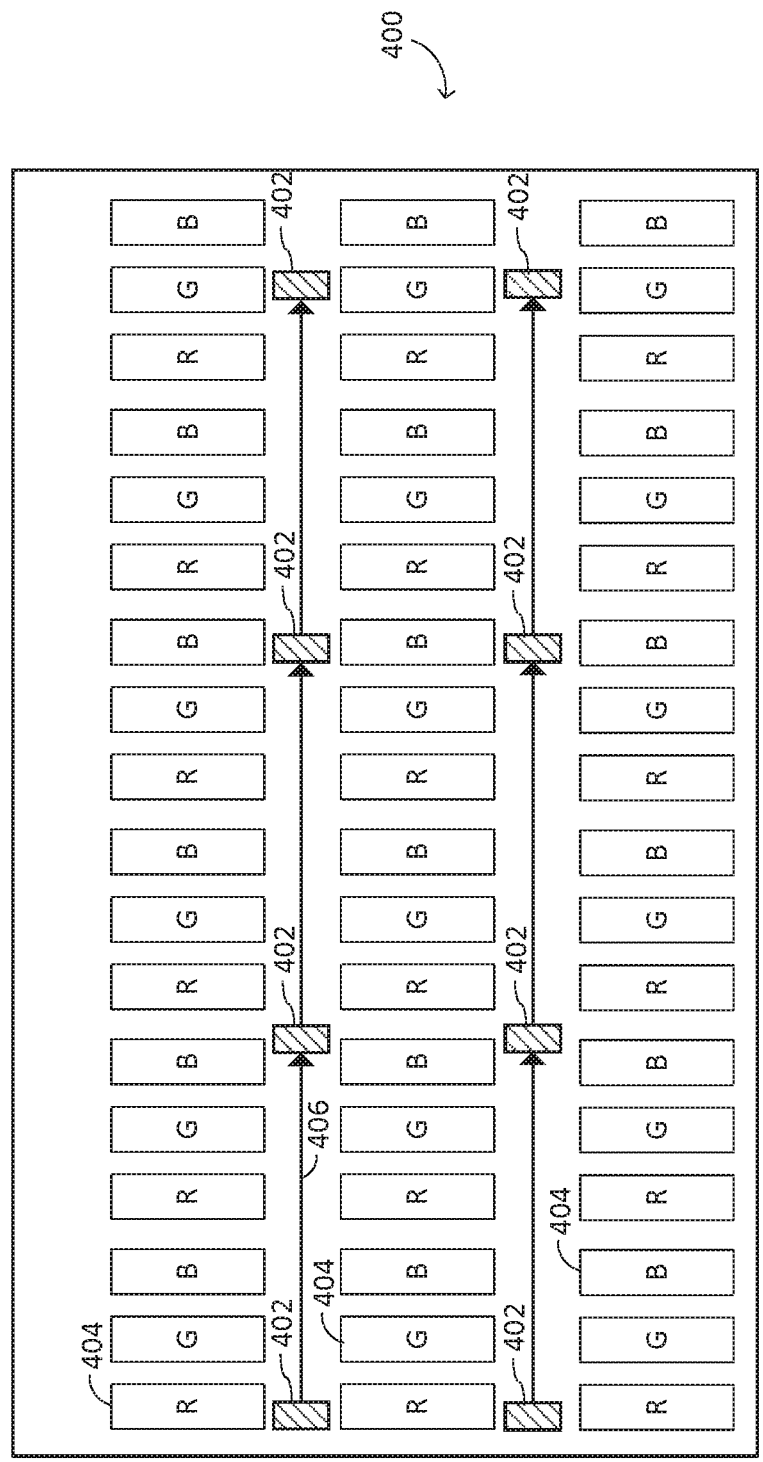
FIGS. 4A-4C illustrate top views of sensor arrangement for imaging an input object.
Figure 4B:
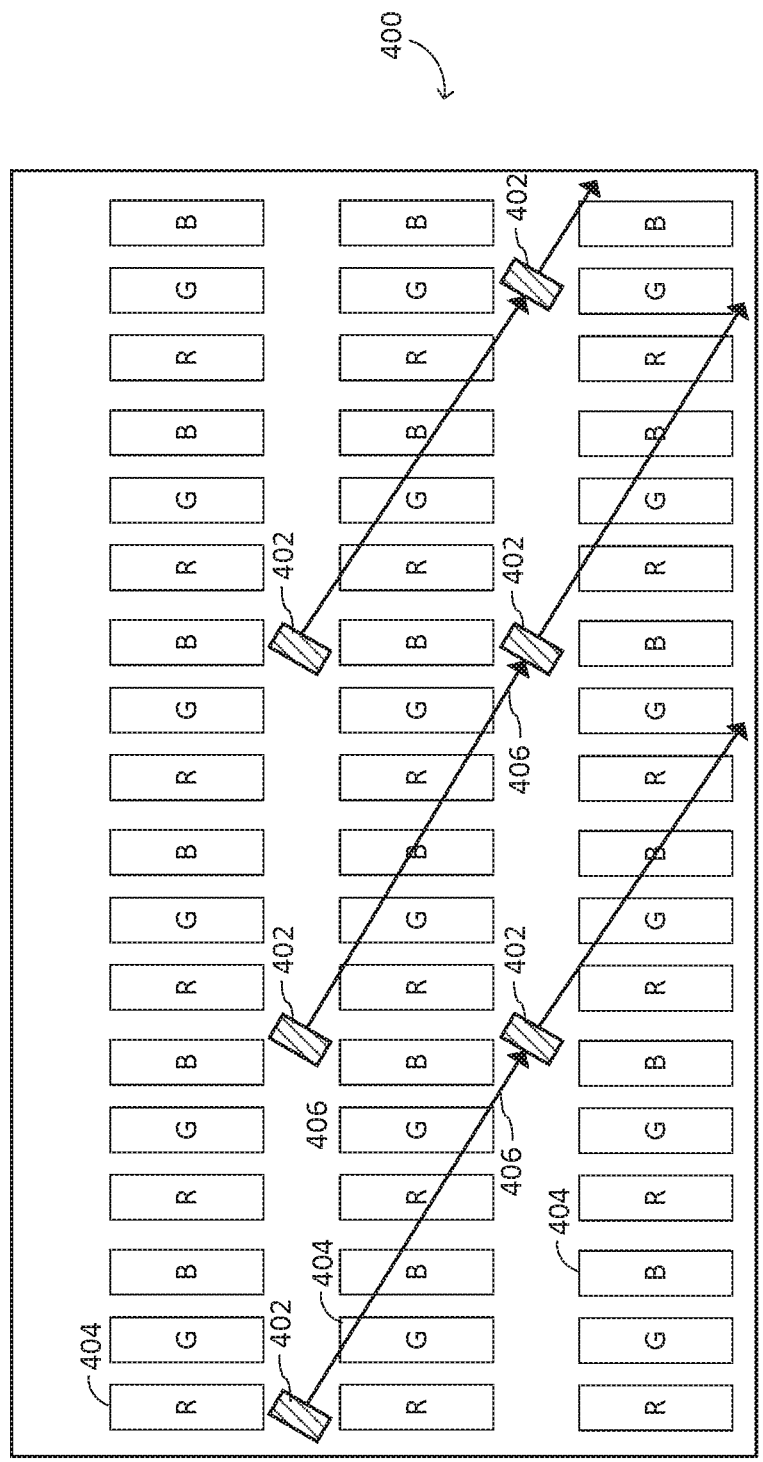
Figure 4C:
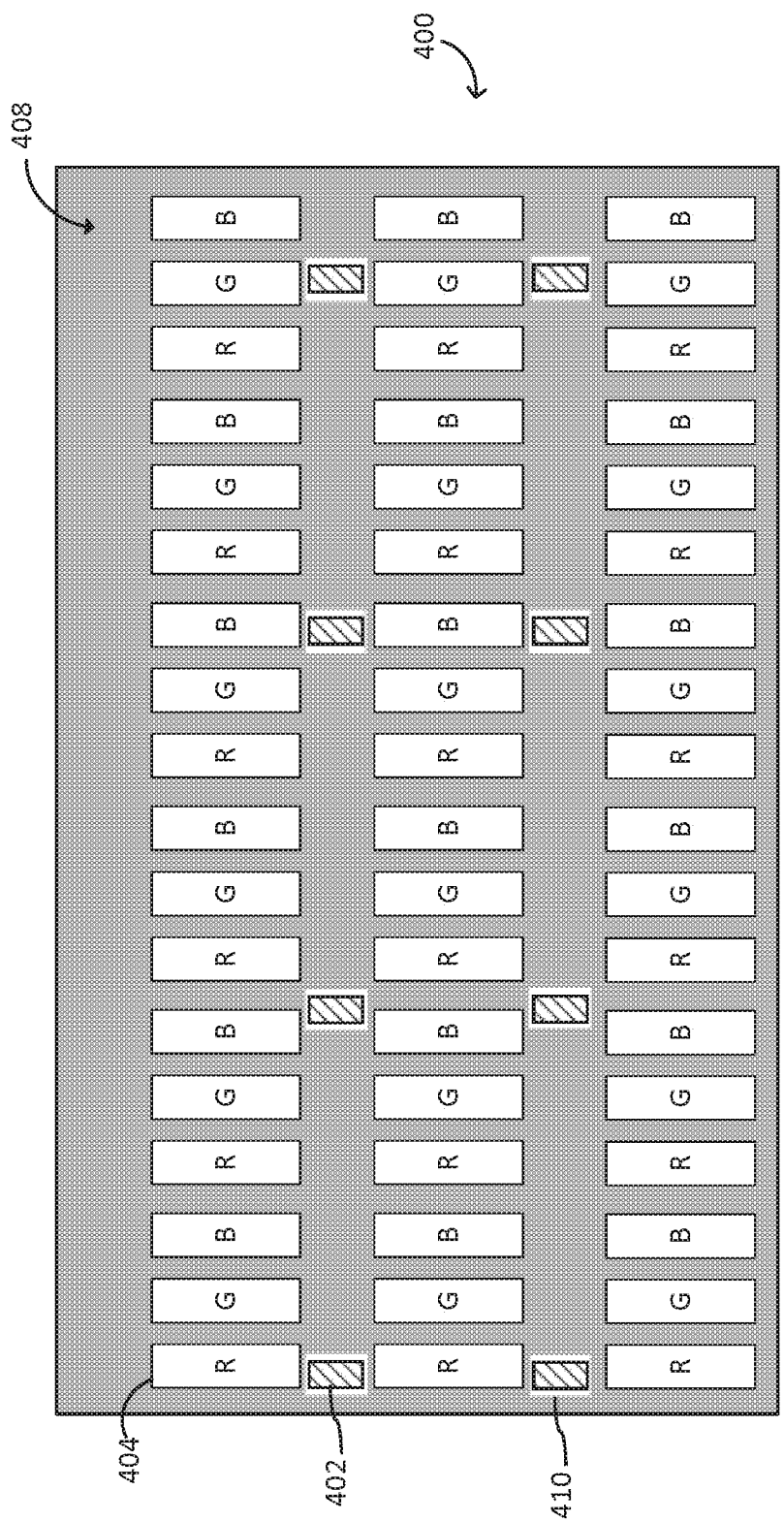

FIGS. 4A-4C illustrate examples of a top view of dual-mirrored optical sensors 400. FIGS. 4A-4B more specifically show the placement of the reflective surfaces relative to various display elements and the transmission path of light between the reflective surfaces.

FIG. 4A shows the reflective surfaces 402 and display elements 404. The display elements 404 may, for example, represent color filters in the case of a LCD display or the LEDs in the case of an OLED or LED display. As shown, the reflective surfaces 402 are generally positioned between rows the display elements 404. The reflective surfaces 402 are further oriented such that the transmission of light rays 406 between reflective surfaces 402 (e.g. first and second reflective surfaces) follows a path that generally remains between the display elements 404. In FIG. 4A, the transmission of light rays 406 does not cut across the display elements 404.

FIG. 4B also shows reflective surfaces 402 and display elements 404. Similar to FIG. 4A, the reflective surfaces 402 are generally positioned between rows the display elements 404. However, in contrast to FIG. 4A, the orientation of reflective surfaces 402 is such that the transmission of light rays 406 between reflective surfaces 402 (first and second reflective surfaces) follows a path that generally cuts across one or more of the display elements 404. The arrangement of FIG. 4B allows for a more compact design.

FIG. 4C shows a blocking layer above the reflective surfaces 402. The blocking layer includes masked surfaces 408, illustrated as shaded areas, and apertures 410, illustrated as un-shaded areas. As previously described, the masked surfaces 408 occlude light, e.g., absorb light and/or reflect light, while the apertures 410 permit light falling within an acceptance cone to reach at least certain of the reflective surfaces 402. As further shown, the masked surfaces 408 do not cover the display elements 404 and, therefore, do not inhibit display functionality.

Figure 5A:
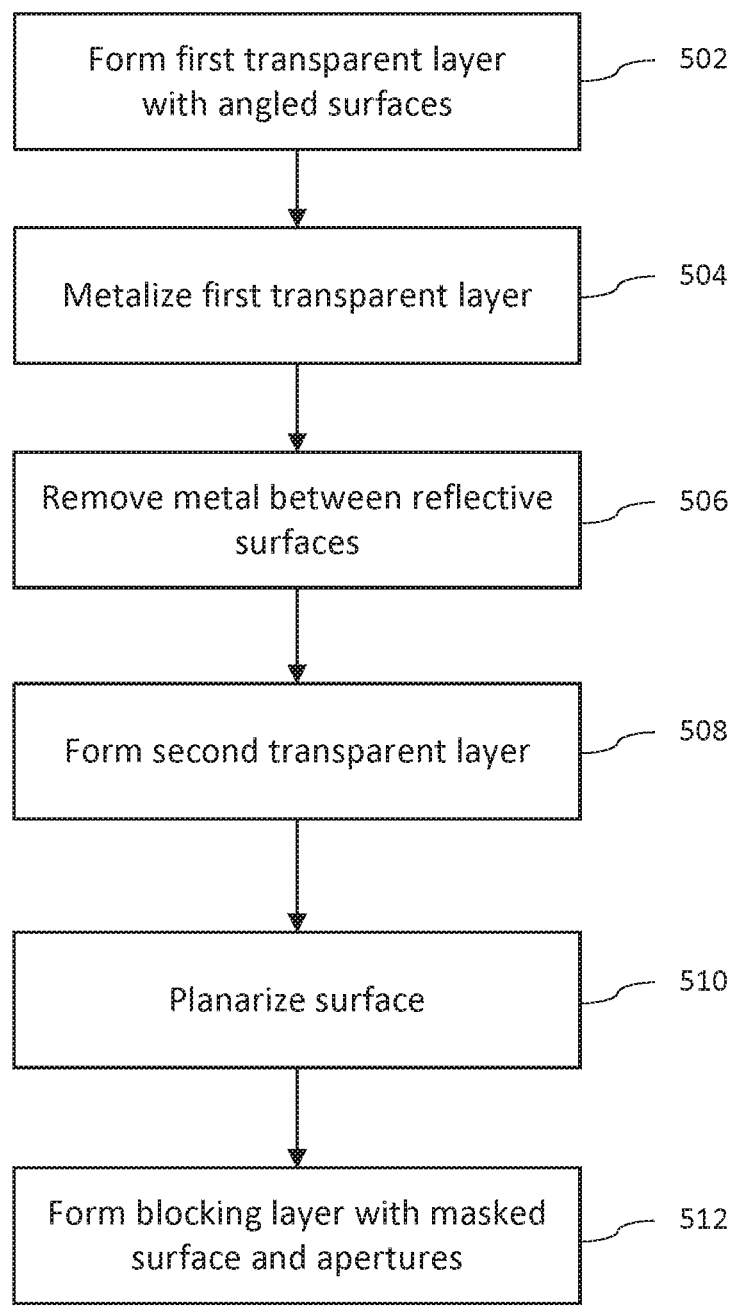
FIGS. 5A-5B illustrate a process for making a sensor arrangement.
Figure 5B:
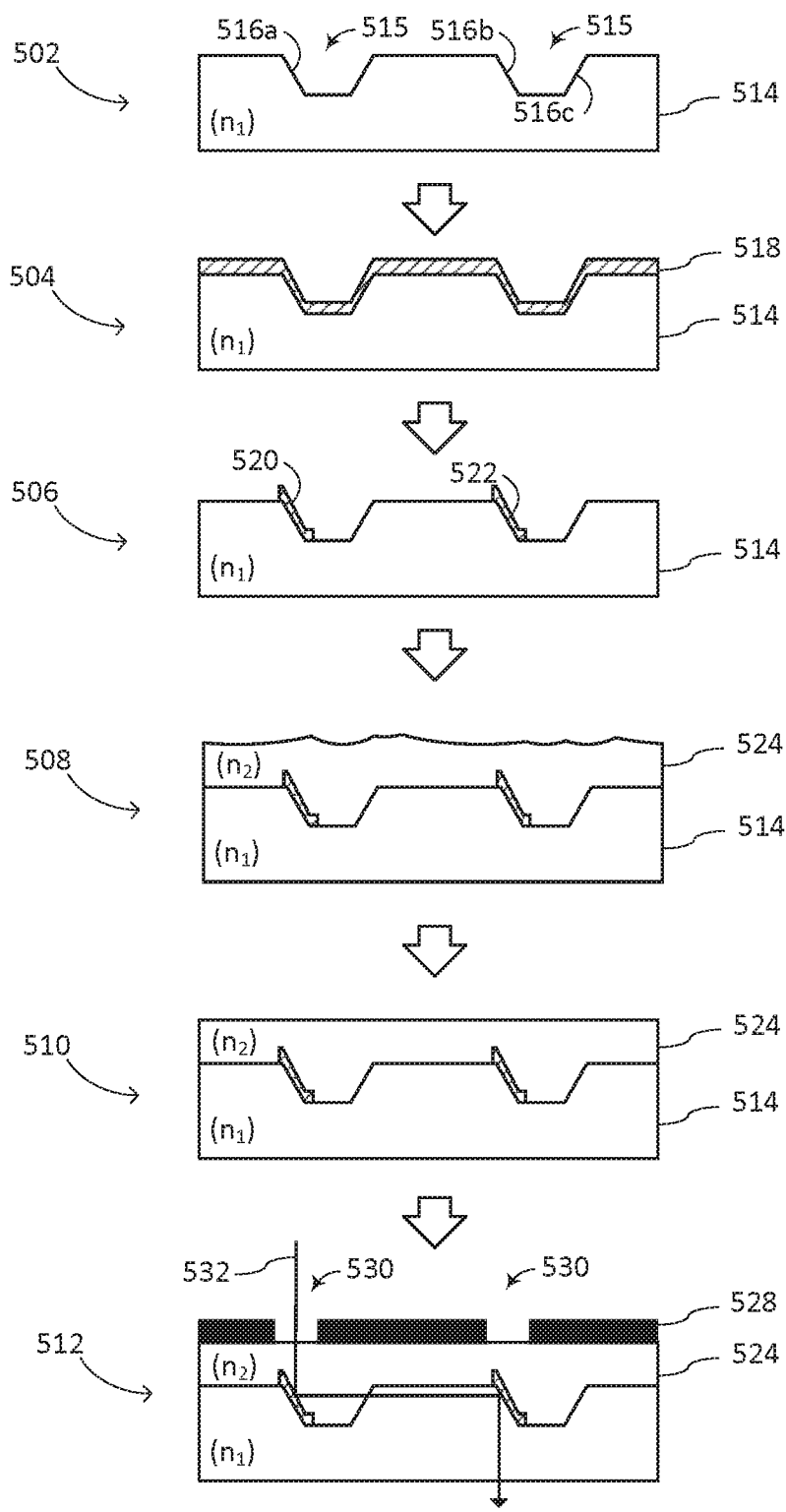

FIGS. 5A and 5B illustrate a method for making and assembling a reflective layer including the dual-mirror arrangement described herein, which may be integrated in a display. Although the steps are described in a particular sequence, the sequence may be altered and/or steps may be combined or eliminated without departing from the scope of the disclosure except where otherwise apparent.

As shown in step 502, a first transparent layer 514 having an index of refraction $n_1$ is formed. The transparent layer may be made from any suitable material, such as color filter glass in the case of an LCD display or a top encapsulating layer in the case of an OLED display. Any transparent material may be used, such as inorganic oxides (SiO2, SiONx, etc.). Non-limiting examples of indices of refraction are in the range of n=1.4 to n=1.6.

Within the first transparent layer 514, angled surfaces 516a, 516b are formed. The angled surfaces 516a, 516b may be formed, for example, by creating voids in the first transparent layer 514. The voids may have any suitable cross section that provides the angled surfaces, such as for example a trapezoidal or triangular cross section. The voids 515 may be formed in a variety of ways including, for example, dry or wet etching, stamping or molding. It will be appreciated that any suitable angle may be selected for the angled surfaces 516a, 516b, generally an angle that will allow light to be directed from one finished reflective surface to another (see step 506), typically in the range of about 40-50 degrees with 45 degrees being a specific example. The angled surfaces 516a, 516b are shown as being generally flat, although the angled surfaces may also be curved (concave or convex) so as to further focus and/or direct reflected light.

In step 504, a top surface of the first transparent layer 514 is coated with a metallization layer 518. The metallization layer 518 may be added by, for example, sputtering material, electroplating or printing. Examples of materials that can be used for the metallization layer include aluminum (Al), gold (Au) or silver (Ag) to name but a few examples. The metallization material may be selected to provide more or less reflection at particular spectral frequencies.

In step 506, portions of the metallization layer 518 are removed, such that metallization only remains on the angled surfaces 516a, 516b thereby resulting in a first reflective surface 520 and a second reflective surface 522. As an alternative to removing portions of the metallization layer 518, the angled surfaces 516a, 516b may be treated prior to the metallization step 504 such that metal only adheres to the angled surfaces (e.g., 516a, 516b) during the metallization step thereby obviating the need for removal of metal material.

In step 508, a second transparent layer 524 is formed from a second material having an index of refraction $n_2$. Formation of the second transparent layer 524 fills the voids 515 formed in the first transparent layer 514 during step 502. The second transparent layer 524 may be added in any suitable manner. Spin coating is one example. Blade coating, slit coating, and spray coating are other examples. In step 510, the top surface of the second transparent layer 524 may be planarized to form a level surface if necessary. It will be appreciated the first transparent layer 514 and second transparent layer 524 may be made from the same type of material or from different types of material.

In step 512, a blocking layer 528 with masked surfaces is optionally formed. The masked surfaces may be formed of any suitable material, for example a material that occludes light. In LCD displays, the black matrix may be used for the masked surfaces 528. Openings are formed in the masked surfaces 528 to form apertures 530 through which light may travel.

The completed assembly forms a reflective layer which allows light to travel from an input object through the periscope structure formed by reflective surfaces 520 and 522 and towards a detector element (not shown). An example of light ray traversing the periscope structure is illustrated by light ray 532. It will be appreciated that only two reflective surfaces are shown and described in FIGS. 5A-5B for purposes of illustration. The reflective layer will have a pair of reflective surfaces for each detector element used as part of an overall sensor arrangement consistent with the preceding description.

As noted, variations of the foregoing process are contemplated. For example, the masked surfaces may be omitted where other display components will provide the needed filtering of stray light. As another example, the particular angled surfaces metalized in step 504 and 506 may be adjusted depending on the configuration. For example, for the arrangement of FIG. 3, surfaces 516a and 516c are metalized instead of surfaces 516a and 516b thereby providing an arrangement such as shown and described in connection with FIG. 3 where the detector element receives light from below.

Moreover, as described in connection with FIG. 2A, the reflective surfaces need not be formed by mirrored surfaces formed through metallization. Instead, the indices of refraction of the first and second transparent layers ($n_1$, $n_2$) may be chosen to create a boundary at, for example, angled surfaces 516, which provides for total internal reflection.

The forging steps can be used to integrate the optical sensor as part of fabrication of the display. The transparent layer with reflective surfaces can be formed over the liquid crystal material in an LCD display, or over the encapsulation in an OLED display. When integrated with an LCD display, the mask surfaces may be the same as the black matrix that is used to separate individual sub-pixels (e.g., RGB) in the color filter layer of the LCD display.

In illustrating the various embodiments, examples have been shown where the pitch size of the detector elements may be on about the same order same as the pitch size of the display elements. However, it will be understood that the pitch of the detector elements and display elements may be different depending on the resolution desired.

It will further be understood that arrangement has generally been described in the context of a sensor for biometric imaging. However, the sensor described herein can also readily be used as a touch sensor and/or to image objects other than a biometric object.

All references cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosure (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

Various embodiments of this disclosure are described herein. Variations of those embodiments may become apparent to those of ordinary skill in the art upon reading the foregoing description. The inventors expect skilled artisans to employ such variations as appropriate, and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A method for making an optical biometric sensor, comprising:
    forming a first transparent layer from a first transparent material having a first index of refraction;
    forming an array of voids on a top of the first transparent layer, the voids having angled surfaces;
    forming a first reflective surface at a first angled surface and a second reflective surface at a second angled surface, wherein the first reflective surface is configured to receive light from above and reflect light towards the second reflective surface, and the second reflective surface is configured to receive the reflected light and to further reflect the light towards a detector element; and
    forming a second transparent layer from a second transparent material having a second index of refraction; wherein the second transparent material fills the array of voids.

2. The method of claim 1, wherein the forming the first reflective surface and the second reflective surface, comprises:
    metalizing a top of the first transparent layer; and
    removing metalized portions of the top of the first transparent layer and preserving metalized portions at the first and second reflective surfaces to form mirrored surfaces.

3. The method of claim 1, wherein the forming the first reflective surface and the second reflective surface comprises selecting the first and second index of refraction to provide for total internal reflection at the first and second angled surfaces.

4. The method of claim 1, wherein the second transparent material is a different material type from the first transparent material.

5. The method of claim 1, further comprising forming a blocking layer, wherein the blocking layer forms a plurality of apertures.

6. The method of claim 5, wherein light reflects from a biometric input object through at least one of the plurality of apertures during use of the optical biometric sensor.

7. The method of claim 6, wherein an acceptance cone is formed by a width of the at least one of the plurality of apertures, a width of the first reflective surface, a width of the second reflective surface, and a detector surface area of the detector element.

8. The method of claim 7, wherein the acceptance cone corresponds to an area of a biometric object input.

9. A method for making an optical biometric sensor to sense light at a detector element reflected from a biometric input object, comprising:
    forming a first transparent layer from a first transparent material having a first index of refraction;
    forming an array of voids on a top of the first transparent layer, the voids having angled surfaces;
    forming a first reflective surface at a first angled surface;
    forming a second reflective surface at a second angled surface;
    forming a second transparent layer from a second transparent material having a second index of refraction; and
    forming a blocking layer.

10. The method of claim 9, wherein the first reflective surface is configured to receive light from above and reflect light towards the second reflective surface, and the second reflective surface is configured to receive the reflected light and to further reflect the light towards the detector element.

11. The method of claim 9, wherein the second transparent material fills the array of voids.

12. The method of claim 9, wherein the blocking layer forms a plurality of apertures.

13. The method of claim 12, wherein the light reflected from the biometric input object reflects through at least one of the plurality of apertures during use of the optical biometric sensor.

14. The method of claim 12, wherein an acceptance cone is formed by a width of at least one of the plurality of apertures, a width of the first reflective surface, a width of the second reflective surface, and a detector surface area of the detector element.

15. The method of claim 14, wherein the acceptance cone corresponds to an area of the biometric input object.

16. The method of claim 12, wherein the blocking layer comprises masked surfaces that occlude light in areas other than the plurality of apertures.

17. The method of claim 9, wherein the forming the first reflective surface and the second reflective surface, comprises:
    metalizing a top of the first transparent layer; and removing metalized portions of the top of the first transparent layer and preserving metalized portions at the first and second reflective surfaces to form mirrored surfaces.

18. The method of claim 9, wherein the forming the first reflective surface and the second reflective surface comprises selecting the first and second index of refraction to provide for total internal reflection at the first and second angled surfaces.

19. The method of claim 9, wherein the second transparent material is a different material type from the first transparent material.

20. A method for making an optical biometric sensor, comprising:

forming a first transparent layer from a first transparent material having a first index of refraction;

forming an array of voids on a top of the first transparent layer, the voids having angled surfaces;

forming a first reflective surface at a first angled surface and a second reflective surface at a second angled surface, wherein the first reflective surface is configured to receive light from above and reflect light towards the second reflective surface, and the second reflective surface is configured to receive the reflected light and to further reflect the light towards a detector element;

forming a second transparent layer from a second transparent material having a second index of refraction; wherein the second transparent material fills the array of voids; and forming a blocking layer, wherein the blocking layer forms a plurality of apertures, wherein light reflects from a biometric input object through at least one of the plurality of apertures during use of the optical biometric sensor, wherein an acceptance cone is formed by a width of the at least one of the plurality of apertures, a width of the first reflective surface, a width of the second reflective surface, and a detector surface area of the detector element, and wherein the acceptance cone corresponds to an area of a biometric object input.

* * * * *